United States Patent [19]
Ikeda et al.

[11] Patent Number: 5,426,865
[45] Date of Patent: Jun. 27, 1995

[54] VACUUM CREATING METHOD AND APPARATUS

[75] Inventors: Towl Ikeda, Yamanashi; Teruo Iwata, Nirasaki, both of Japan

[73] Assignee: Tokyo Electron Limited, Tokyo, Japan

[21] Appl. No.: 115,550

[22] Filed: Sep. 3, 1993

[30] Foreign Application Priority Data

| Sep. 3, 1992 | [JP] | Japan | 4-262880 |
| Sep. 8, 1992 | [JP] | Japan | 4-265381 |
| Dec. 7, 1992 | [JP] | Japan | 4-351310 |

[51] Int. Cl.$^6$ .................................. H01L 21/00
[52] U.S. Cl. .............................. 34/92; 34/404; 34/408
[58] Field of Search ......... 34/403, 404, 407, 408, 34/409, 410, 412, 92

[56] References Cited

U.S. PATENT DOCUMENTS

| 2,380,339 | 7/1945 | Siedentopf | 34/410 |
| 3,255,534 | 6/1966 | Kan | 34/92 |
| 3,487,554 | 1/1970 | Tooby | 34/92 |
| 5,222,307 | 6/1993 | Oba et al. | 34/404 X |
| 5,237,756 | 8/1993 | Hurwitt | 34/92 X |
| 5,240,556 | 8/1993 | Ishikawa et al. | |
| 5,314,541 | 5/1994 | Saito et al. | |

Primary Examiner—Henry A. Bennet
Assistant Examiner—William C. Doerrler
Attorney, Agent, or Firm—Oblon, Spivak, McClelland, Maier & Neustadt

[57] ABSTRACT

A vacuum creating method comprising preparing a chamber for forming a space which can be made so atmospheric and vacuous as to allow a substrate to be directly or indirectly carried in and out of the space, exhausting the chamber, filling the space in the chamber with a $CO_2$ gas whose vapor pressure becomes larger than 1 atm at ambient temperature but smaller than 10 Torr at a temperature lower than the ambient temperature, carrying the substrate into the chamber, cooling the $CO_2$ gas to solidify, thereby making an internal pressure in the chamber highly vacuous, carrying the substrate out of the chamber, and heating the solidified dry ice to vaporize thereby returning the internal pressure in the chamber to atmospheric pressure.

22 Claims, 12 Drawing Sheets

VACUUM CREATING METHOD AND APPARATUS

BACKGROUND OF THE INVENTION

1. Field of the Invention

The present invention relates to a method and an apparatus for creating vacuum used when a substrate is carried into and out of a process chamber and, more particularly, it relates to a method and an apparatus for making each of load lock chambers highly vacuous in the etching and CVD systems.

2. Description of the Related Art

In the course of applying the film forming and etching processes to semiconductor wafers, it is needed that the process chamber is kept highely vacuous because particles must be prevented from adhering to the surface of each wafer. The process chamber is exhausted by a vacuum pump and thus made vacuous, having a vacuum degree smaller than 10 Torr or preferably ranging from $10^{-3}$ to $10^{-9}$ Torr. In addition, load lock chambers are arranged around the process chamber to prevent atmospheric air and particles from directly entering into the process chamber. It is also needed that each load lock chamber is made clean and vacuous to same extent to which the process chamber is made so.

In order to make the load lock chamber highly vacuous, the load lock chamber is exhausted by rotary, dry and turbo molecular pumps. It is also returned atmospheric while filling it with nitrogen gas after the wafer is carried out of it. When it is repeatedly made atmospheric and vacuous in this manner, particles most of which have been stuck and piled on its inner walls float and adhere to the surface of the wafer.

On the other hand, various kinds of gas molecule such as water component, carbon oxide, carbon dioxide and nitrogen have adhered to the surface of each wafer and the inner walls of each chamber and these gas molecules are likely to release from the wafer and the inner walls of the chamber under depressurized state. In order to vacuum-exhausting the gas molecules including those released from the semiconductor wafer by the above-mentioned vacuum pumps, therefore, the time needed to exhaust the chamber becomes long and the chamber is not exhausted sometimes to a desired vacuum degree.

A trap device of the radiator type is used to make each load lock chamber highly vacuous. The conventional trap device has a passage which is commonly used by coolant and heat medium, and when gas molecules in the chamber are to be trapped, coolant is passed through the passage and when the chamber is to be returned atmospheric, coolant is discharged through it and heat medium is then passed through it. In the case of the conventional trap device, however, it takes a long time for coolant in the passage to be replaced by heat medium. In addition, the heat wearing of the passage material is caused and the life of the passage is thus made short because cooling and heating are repeated through the passage. Further, when air is supplied, as coolant, into the passage, water component in the air is condensed on the inner wall of the passage soon after the supply of the air is started. When the water has frozen solid, the passage is plugged by the ice. This prevents heat exchange from being achieved between the coolant and the trap device component.

SUMMARY OF THE INVENTION

An object of the present invention is therefore to provide a vacuum creating method and apparatus capable of making each chamber highly vacuous for a shorter time while effectively preventing particles from floating in the chamber.

Another object of the present invention is to provide a vacuum creating method and apparatus more excellent in heat exchanging capacity and durability.

According to an aspect of the present invention, there can be provided a vacuum creating method comprising preparing a chamber for forming a space which can be made so atmospheric and vacuous as to allow a substrate to be directly or indirectly carried in and out of the space; exhausting the chamber; filling the space in the chamber with a gas whose vapor pressure becomes larger than 1 atm at ambient temperature but smaller than 10 Torr at a temperature lower than the ambient temperature; carrying the substrate into the chamber; cooling the gas to solidify, thereby making an internal pressure in the chamber highly vacuous; carrying the substrate out of the chamber; and heating the solidified object to vaporize, thereby returning the internal pressure in the chamber to atmospheric pressure.

According to another aspect of the present invention, there can be provided a vacuum creating apparatus comprising a chamber for forming a space which can be made so atmospheric and vacuous as to allow a substrate to be directly or indirectly carried into and out of the space; means for exhausting the chamber; and means for trapping gas molecules present in the space of the chamber, said trapping means including a member having a surface on which the gas molecules are condensed and solidified, a cooling passage which is communicated with a coolant supply source and through which a coolant is supplied to cool the member, and a heat medium passage which is communicated with a heat medium supply source and through which a heat medium is supplied to heat the member, wherein said coolant and heat medium passages attached to the member are made independent of the other.

According to the present invention, equilibrium vapor pressure in each load lock chamber can be set smaller than 10 Torr only by cooling $CO_2$ gas in the chamber to a temperature lower than ambient temperature and solidifying it. When $CO_2$ gas is set same as or higher than ambient temperature, internal pressure in the chamber can also be made same as or larger than atmospheric pressure.

According to the present invention, a medium passage through which gases such as the above-mentioned $CO_2$ gas is cooled and heated is made independent of the other. The rising of temperature change can be thus made more sharp to shorten the time during which these gases are solidified and vaporized.

When the load lock chamber is exhausted by the pump, the flow of gas in the chamber as largely disturbed and when another load lock chamber arranged around the process chamber is filled with nitrogen gas, the flow of gas in this load lock chamber is also largely disturbed. Particles which have been piled and stuck on the bottom and inner wall faces of each load lock chamber are thus floated and scattered in the chamber to fall and adhere to the surface of each semiconductor wafer. This becomes remarkable particularly when the load lock chamber is quickly made vacuous and returned atmospheric.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A case where the vacuum creating method according to an embodiment of the present invention is applied to load lock chambers of the etching system will be described with reference to the accompanying drawings.

Figure 1:
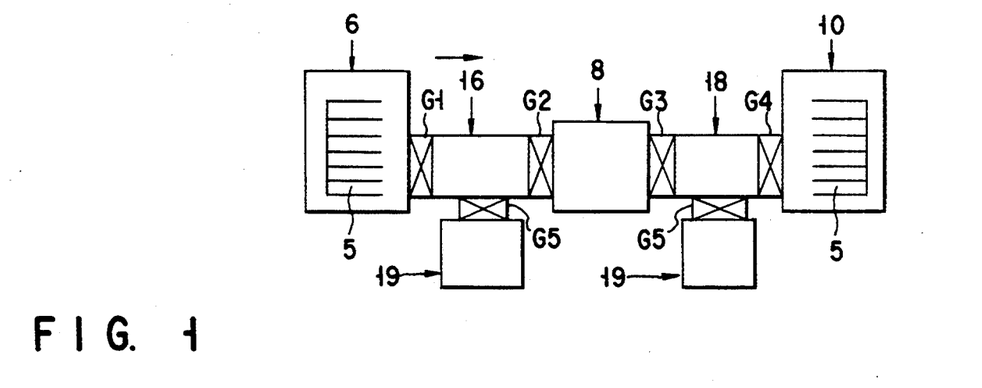
FIG. 1 schematically shows the whole of the semiconductor water processing system having a process chamber and two load lock chambers.

As shown in FIG. 1, a sender 6 is arranged upstream the etching system and a receiver 10 downstream it. A process chamber 8 and two load lock chambers 16, 18 are arranged between the sender 6 and the receiver 10. A wafer cassette 5 and a wafer carrying unit (not shown) are housed in each of the sender 6 and the receiver 10 and plural sheets of semiconductor wafers a are housed in each of the wafer cassettes 5. A gate valve G1 is attached to an inlet side of the first load lock chamber 16 and a gate valve G2 to an outlet side thereof. A gate valve G3 is attached to an inlet side of the second load lock chamber 18 and a gate valve G4 to an outlet side thereof. Reproducing chambers 19 are connected to the first and second load lock chambers 16 and 18, respectively, through gate valves G5.

Figure 2:
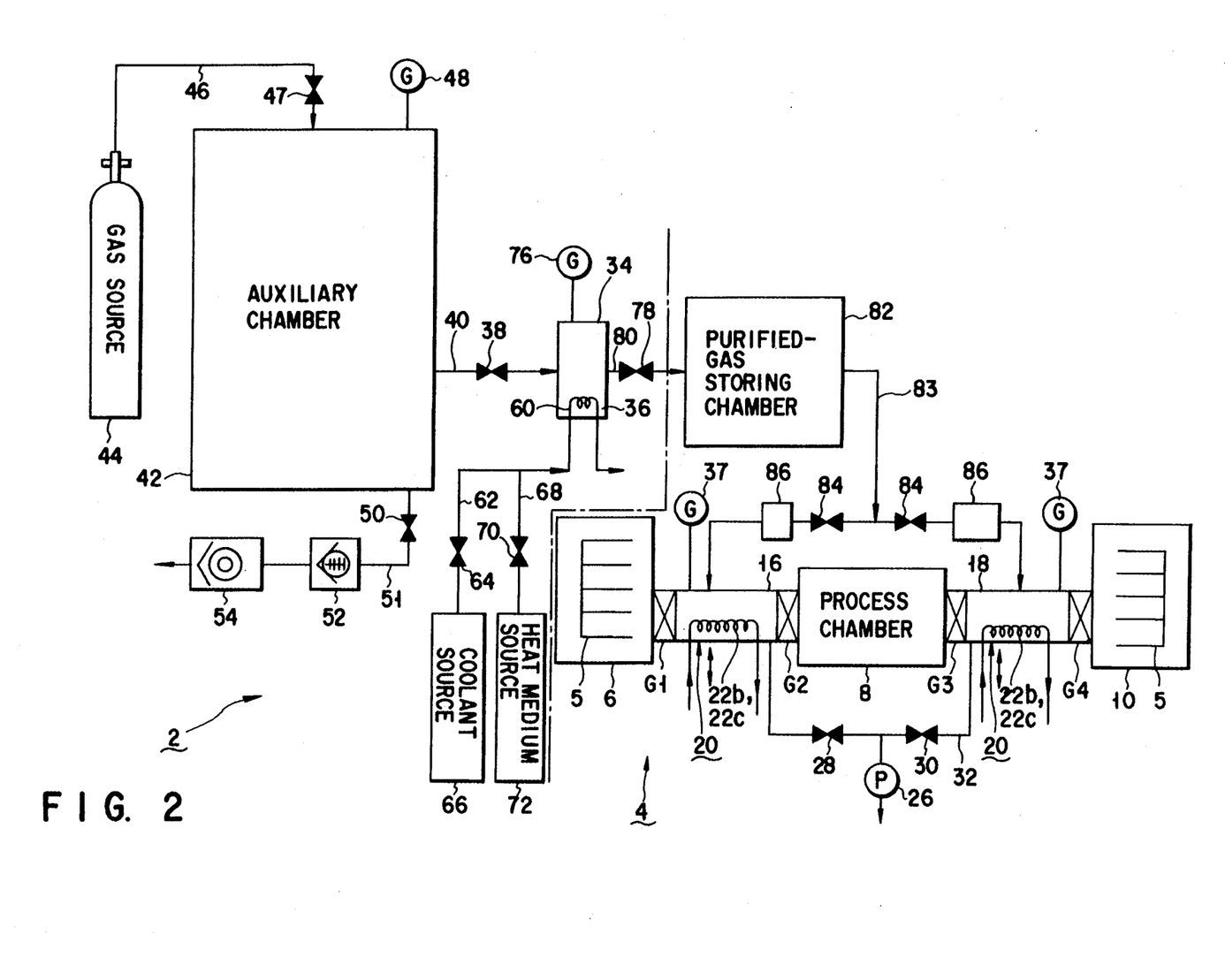
FIG. 2 is a block diagram showing an apparatus for purifying $CO_2$ gas which is introduced into the load lock chambers.

A gas purifying apparatus will be described with reference to FIGS. 2 and 3.

The gas purifying apparatus 2 has a trap chamber 34 in which at least two gases having different condensation temperatures are trapped. Cooling means 36 is arranged in the trap chamber 34, and temperature of coolant is lower than higher condensation point temperature of the at least two gases. The coolant is allowed to flow through the cooling means 36. The condensation point temperature used herein includes those condensation points at which gas changes to fluid and gas also changes to solid.

An auxiliary chamber 42 is communicated with the trap chamber 34 through a passage 40. A valve 38 is attached to the passage 40. The auxiliary chamber 42 has a volume larger than that of the trap chamber 34.

Each of the chambers 34 and 42 is defined by stainless steel, for example. The trap chamber 34 is set to have a volume of about 10 liters, for example, and the auxiliary chamber 42 to have a volume of about 1000 liters, for example, 100 times larger than that of the trap chamber 34. Their volumes are not limited to these values but it may be in a range of 1–10 liters in the case of the trap chamber 34 and in a range of 100–1000 liters in the case of the auxiliary chamber 42. The rate of these volumes represents the extent to which impurity gas is diluted as will be described later.

A gas source 44 is communicated with the auxiliary chamber 42 through a pipe 46. A valve 47 is attached to the pipe 46. The gas source 44 is filled with $CO_2$ gas, which has a purity of 99.999 vol %, under high pressure.

A pressure gauge 48 is attached to the auxiliary chamber 42 to detect internal pressure in it. A pipe 51 is also attached to it and a switch valve 50, turbo molecular and rotary pumps 52 and 54 are attached to the pipe 51 in this order when viewed from upstream the pipe 51.

Figure 4:
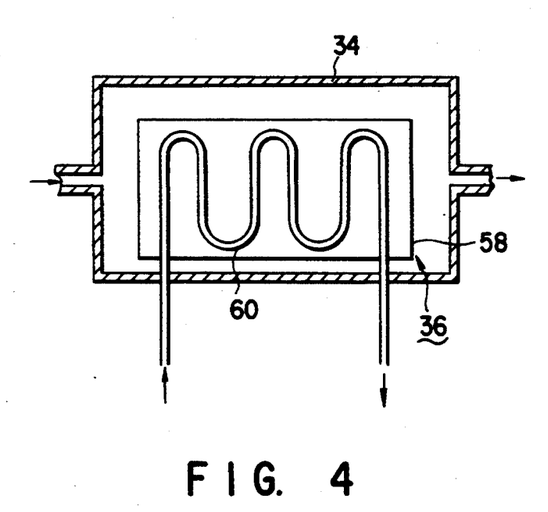
FIG. 4 is a sectional view showing a trap chamber of the gas purifying apparatus.
Figure 5:
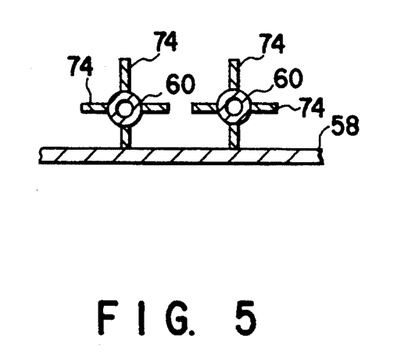
FIG. 5 is a sectional view showing cooling means arranged in the trap chamber.

As shown in FIGS. 4 and 5, the cooling means 36 has a cooling plate 58 and a meandering pipe 60. The cooling plate 58 is made of aluminium, for example, having a high heat conductivity. The meandering pipe 60 extends zigzag like a radiator and it is attached to the cooling plate 58. It is divided into two 62 and 68 on its inlet side. One 62 of them is connected to a coolant source 66, in which fluid nitrogen is contained, through a switch valve 64. The other 68 is connected to a heat medium source 72 through a switch valve 70. Nitrogen gas or air of ambient temperature, for example, is contained in the heat medium source 72.

It is preferable that the surface area of each of the zigzag pipe 60 and the cooling plate 58 is set to meet the volume of the chamber. Fur this purpose, plural fins 74 extend from the outer circumference of the pipe 60, as shown in FIG. 5.

The cooling means 36 including the cooling plate 58 may be attached not only to one inner face of the trap chamber 34 but also all inner faces thereof if necessary. In addition, any coolant may be used if the temperature of this coolant supplied is lower than the condensation temperature of $CO_2$ gas which is in a range of $-70 - -80°$ C. It is preferable that the vapor pressure of $CO_2$ gas particularly at the temperature of coolant is considerably smaller than one barometric pressure and that the coolant pressure is higher than the condensation temperature of impurity gas.

In a case where the density of impurity gas is considerably low, coolant may keep such a vapor pressure that causes impurity gas not to be trapped even if its temperature is same as or lower than the condensation temperature of impurity gas. The pressure gauge 48 is attached to the trap chamber 34 to detect internal pressure in it.

The trap chamber 34 is communicated with a purified-gas storing chamber 82 of relatively large volume through a passage or pipe 80. A gas supply passage or pipe 83 extending from the gas storing chamber 82 is divided into two, which are communicated with the first and second load lock chambers 16 and 18, respectively. A switch valve 84 and a mass flow controller (MFC) 86 are attached to each of the divided pipes.

Figure 3:
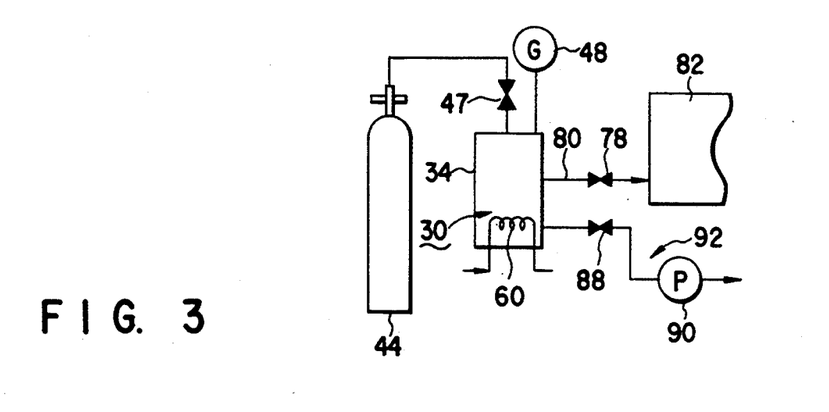
FIG. 3 is a block diagram showing a part of the gas purifying apparatus.

As shown in FIG. 3, it may be arranged that the trap chamber 34 is connected directly to the gas source 44 and that the chamber 34 is exhausted directly by a vacuum, pump 90.

Figure 8:
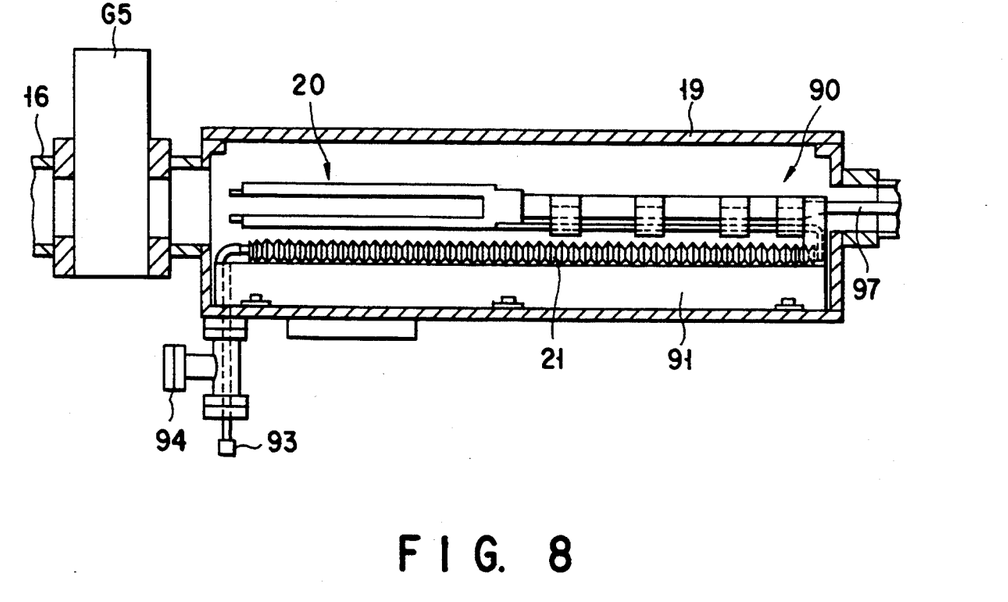
FIG. 8 is a vertically-sectioned view showing the trap device arranged in a reproducing chamber.
Figure 9:
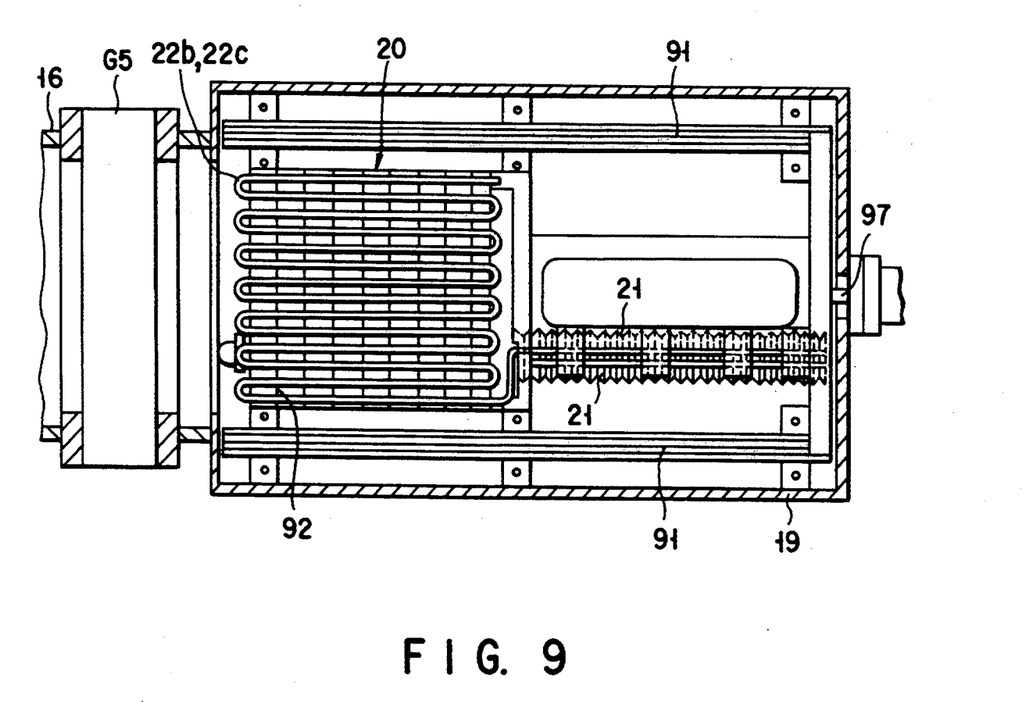
FIG. 9 is a horizontally-sectioned view showing the trap device arranged in the reproducing chamber.

As shown in FIGS. 8 and 9, the trap device 20 is arranged in each of the reproducing chambers 19. The main portion of the trap device 20 comprises a pair of meandering aluminium-made pipes 22b and 22c. These pipes 22b and 22c are fixed onto a base 22a by fins 22d and wires 92. The trap device 20 has substantially same structure as the radiator in a car so that it can have a size as small as possible but a surface area as large as possible. Each of the pipes 22b and 22c has an outer diameter of 5 mm and an inner diameter of 4 mm. The trap devices 20 can move into and out of the load lock chambers 16 and 18 through gate valves G5. Each of the reproducing chambers 19 can be exhausted vacuous by the turbo molecular pump 26.

Figure 6:
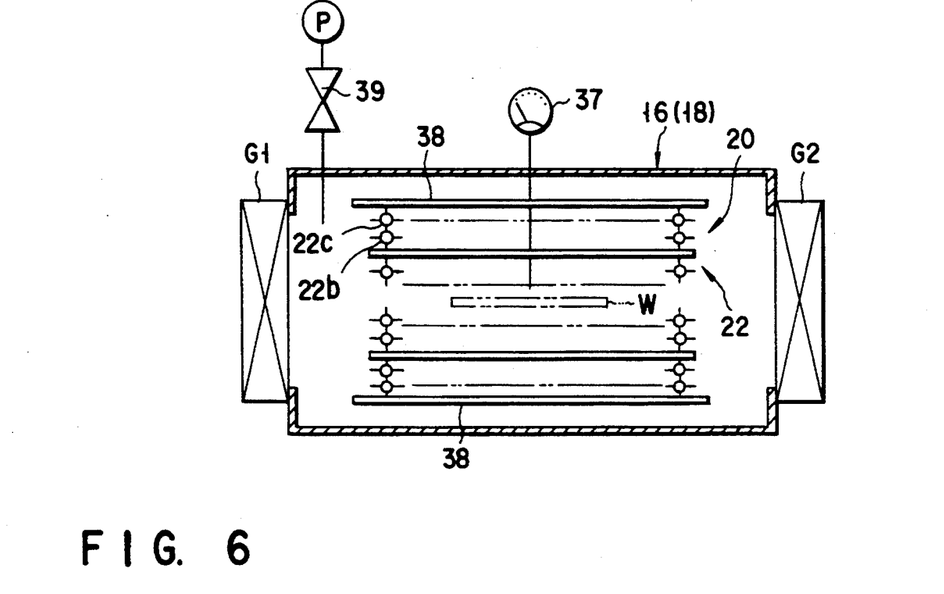
FIG. 6 is a sectional view showing a trap device in the load lock chamber.

As shown in FIG. 6, reflector plates 38 are arranged outside the trap device 20. A detecting front end of a pressure gauge 37 is positioned inside the trap device 20. A vent valve 39 is attached to the chamber 16.

Figure 10:
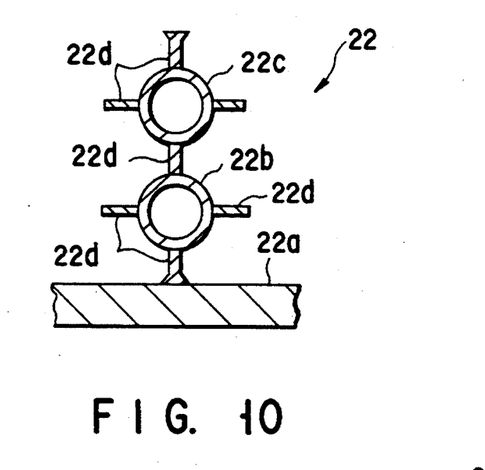
FIG. 10 is a sectional view showing cooling and heating pipes attached to the trap device.

As shown in FIG. 10, the pipes 22b and 22c are stacked on the base 22a by the fins 22d, which are fixed to the pipes 22b, 22c and the base 22a by brasing, for example. The meandering pipes 22b and 22c are formed by the roll bonding manner, one of the cold press forming methods, according to which an aluminium plate is partly press-contacted to form a fluid passage therein by its not-contacted portion.

Figure 7:
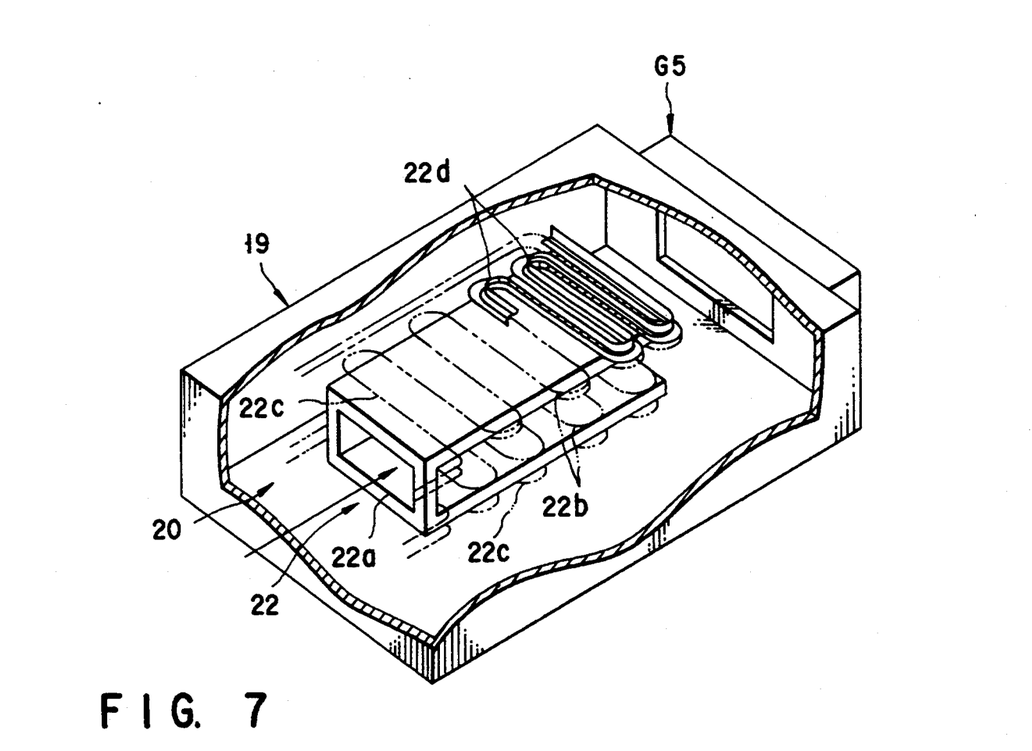
FIG. 7 is a perspective view showing the trap device arranged in the load lock chamber.

The trap device 20 can be moved by a horizontal drive unit 90. An operation rod 97 of the horizontal drive unit 90 is connected to the trap device 20 at its one end and to a rod of a hydraulic cylinder (not shown) at the other end (not shown). Guides (not shown) attached to the trap device 20 are slidably engaged with a pair of rails 91. Two flexible pipes 21 are arranged parallel to the rails 91. One of the flexible pipes 21 is communicated with the coolant pipe 22b through which fluid nitrogen is supplied.

The other flexible pipe 21 is communicated with the heat medium pipe 22c. Hot water or air is supplied to a supply pipe 93 which is communicated with the heat medium pipe 22c, and hot water and air supplied to the pipe 93 are changed over by a switch valve 94.

Figure 11:
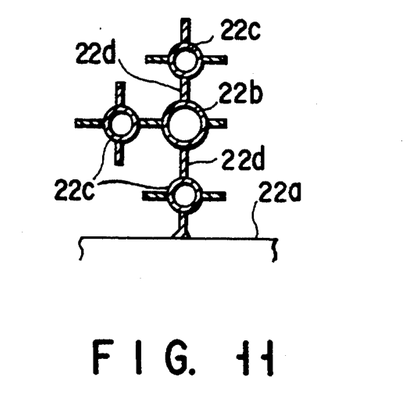
FIG. 11 is a sectional view showing a variation of the cooling and heating pipes.

As shown in FIG. 11, plural heat medium pipes or passages 22c may be arranged round one coolant pipe or passage 22b. The pipes 22b and 22c are connected to one another by the fins 22d.

Figure 12:
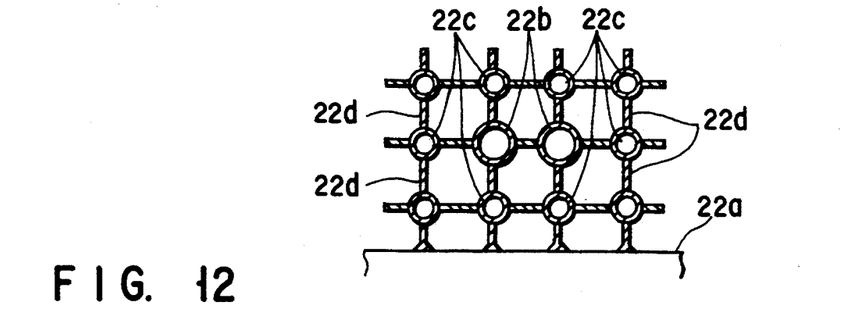
FIG. 12 is a sectional view showing another variation of the cooling and heating pipes.

As shown in FIG. 12, plural coolant and heat medium pipes 22b and 22c may be arranged in a lattice. In short, two coolant pipes 22b are arranged side by side in the center portion of the lattice and the heat medium pipes 22c are arranged around them.

When the number of the heat medium pipes 22c used is made larger than that of the coolant pipes 22b, as shown in FIGS. 11 and 12, the time needed to reproduce the trap device 20 can be made shorter.

Each of the trap devices 20 contains that gas with which the load lock chambers 16 and 18 are filled. It is desirable that this filled gas has a vapor pressure higher than atmospheric pressure at least under ambient temperature and that its equilibrium vapor pressure under cooled temperature, lower than ambient temperature, is lower than 10 Torr or preferably lower than $10^{-3}$ Torr not to cause particles each having a size of sub-microns to be floated. $CO_2$ gas is used as the filled gas in this example. As shown in Table 1, the equilibrium vapor pressure of this $CO_2$ gas becomes $10^{-3}$ Torr at 105° K. The equili-brium vapor pressure of water component ($H_2O$) in each of the load lock chambers 16 and 18 is quite lower than $10^{-3}$ Torr at 105° K. and this prevents water component from adhering to semiconductor wafers W.

TABLE 1

| gas | Vapor Pressure (Torr) | | | | | |
|---|---|---|---|---|---|---|
| | $10^{-5}$ | $10^{-4}$ | $10^{-3}$ | $10^{-2}$ | $10^{-1}$ | 1 |
| $CO_2$ | 90.5 | 97.2 | 105 | 114 | 124 | 136 |
| $H_2O$ | 172 | 183 | 197 | 213 | 231 | 253 |
| Absolute Temperature (K) | | | | | | |

Even if water component is present in the first load lock chamber 16, it cannot add any bad influence to vacuum exhaustion. This is because the vapor pressure of $H_2O$ obtained is quite lower than that or $10^{-3}$ Torr of $CO_2$ obtained at 105° K., for example. The load lock chambers 16 and 18 are filled with $CO_2$ gas. It is therefore desirable that those gate valves G1 and G4 which are opposed to atmospheric have such a structure on their atmospheric sides that prevents any other gases from entering into the load lock chambers 16 and 18. For example, $CO_2$ gas is caused to flow, in a laminar flow, from its outlet to its inlet. Or the sender 6 and the receiver 10 are filled with $CO_2$ gas. The operation of creating vacuum in the load lock chambers 16 and 18 will be described with reference to FIGS. 13 and 14.

Figure 13:
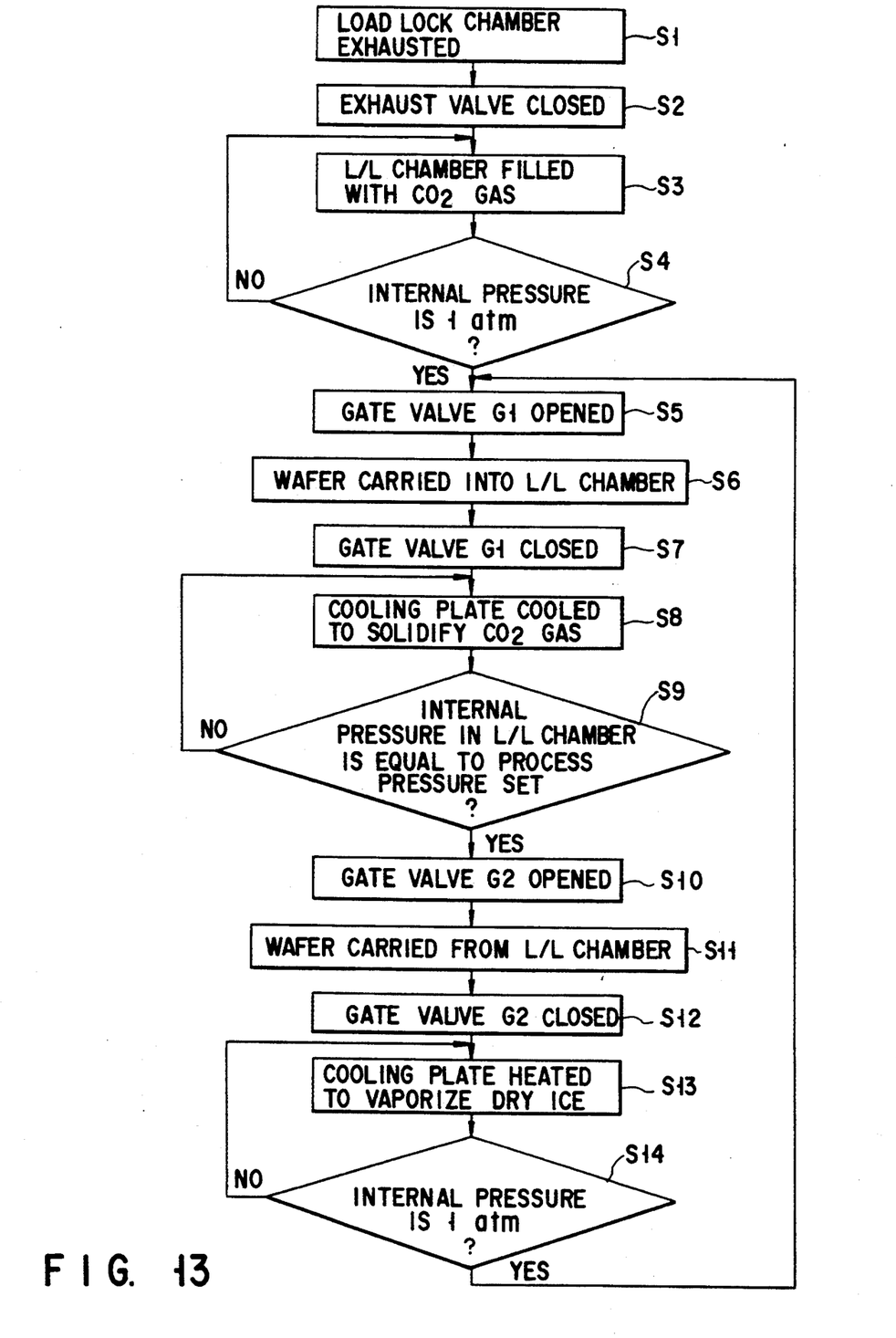
FIG. 13 is a flow chart showing the vacuum creating method according to an embodiment of the present invention.
Figure 14:
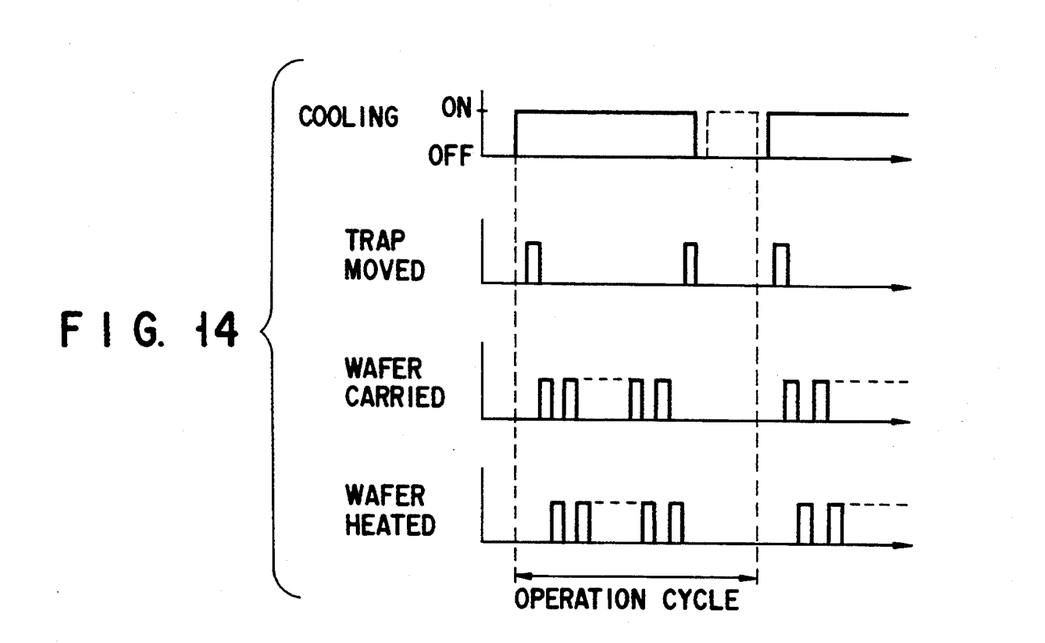
FIG. 14 is a timing chart showing how the trap device is operated.

The load lock chamber 16 and the auxiliary chamber 19 are exhausted lower than $10-10^{-3}$ Torr (Step S1). The exhaust valve 28 is closed (Step S2) and $CO_2$ gas is supplied into the load lock chamber 16 (Step S3). It is confirmed on the basis of pressure detection result whether or not internal pressure in the load lock chamber 16 reaches atmospheric pressure (or 1 atm) (Step S4). In order to prevent air from being attracted into the load lock chamber 16, $CO_2$ gas may be filled in the chamber 16 in this case until the internal pressure in it becomes a little higher than 1 atm.

When the internal pressure in the chamber 16 becomes higher than 1 atm, the gate valve G1 is opened (Step S5) and the wafer w is carried from the cassette 5 in the sender 6 into the load lock chamber 16 (Step S6).

After the gate valve G1 is closed (Step S7), the gate valve G5 is opened and the cooling plate 22a of the trap device 20 is moved into the load lock chamber 16. The cooling plate 22a of the trap device 20 is cooled to solidify $CO_2$ gas on the cooling plate 22a (Step S8). In short, fluid nitrogen is passed through the meandering pipe 22b to cool the cooling plate 22a about $-196°$ C. CO gas is thus condensed and solidified as dry ice on the cooling plate 22a.

Other component gases such as water vapor in the load lock chamber 16 are also cold-trapped and the internal pressure in it becomes lower. As will be described later, raw material $CO_2$ gas (or gas contained in the gas source 4a) has a purity of 99.999 vol % at this time and the amount of impurities in $CO_2$ gas purified has been reduced to about a hundredth of that of raw material $CO_2$ gas. Therefore, almost all of $CO_2$ gas filled is solidified and the internal pressure in the chamber 16 thus reaches a high vacuum degree of $10^{-6}$-$10^{-7}$ Torr. When the amount of water component, for example, condensed on the meandering pipe 22b is saturated, the gate valve G5 is opened and the trap means 22 is returned into the reproducing chamber 19.

The supply of coolant into the pipe 22b is stopped. It is preferable that nitrogen gas of ambient temperature is supplied, instead of coolant, to the pipe 22b and that air or hot water is supplied, as heat medium, to the other pipe 22c at the same time. The reproducing chamber 19 is exhausted at this time by the turbo molecular pump. Water component and others condensed on the pipe 22b are therefore vaporized by the heating of heat medium through the fins 22d and the base 22a and exhausted by the turbo molecular pump. The trap means 20 as thus reproduced.

It is confirmed whether or not the internal pressure in the load lock chamber 16 becomes equal to process pressure set (Step S9). When it reaches the process pressure set, the gate valve G2 is opened (Step S10) and the wafer W is carried from the load lock chamber 16 into the process chamber 8 (Step S11). The gate valve G2 is closed (Step S12) and the cooling or refrigerating plate 22a is heated to vaporize the dry ice (Step S13). In short, heat medium such as nitrogen gas and air having a temperature same as or higher than ambient temperature is passed through the pipe 22c, while keeping the gate valves G1 and G2 closed, so as to heat the cooling plate 22a. All of the dry ice is thus vaporized and the internal pressure in the load lock chamber 16 is made equal to 1 atom accordingly.

It is found that the internal pressure in the load lock chamber 16 has been reduced 1 atm (Step S14), the process is returned to the Step S5 and the gate valve G1 is opened. When the steps S6–S14 are then similarly repeated as described above, a next wafer a is carried into the load lock chamber 16.

When the processed wafer W in the process chamber 8 is to be carried into the receiver 10, the other load lock chamber 18 is used. The operation which will be carried out in the load lock chamber 18 is similar to the above-described one in the load lock chamber 16. When $CO_2$ gas is repeatedly solidified and vaporized in the load lock chamber 18, internal pressure in the chamber 18 changes from atmospheric pressure to high vacuum and from high vacuum to atmospheric pressure.

It will be described how $CO_2$ gas to be filled in the load lock chambers 16 and 18 is purified (or how impurities in $CO_2$ gas are removed to enhance the purity of this $CO_2$ gas).

About 10 ppm of impurity components such as oxygen and nitrogen are contained in industrial $CO_2$ gas available from the market. Oxygen and nitrogen are made fluid at the solidification temperature of $CO_2$ gas but the fluid flows down onto the bottom of chamber, this is vaporized. This prevents the load lock chambers from being made highly vacuous.

The auxiliary, trap and purified-gas storing chambers 42, 34 and 82 are exhausted fully vacuous by the vacuum pumps 52 and 54.

The switch valve 78 is closed and the valve 38 is opened. Whale reducing gas supply pressure, at which $CO_2$ gas is supplied from the gas source 44, from about 50 to 1 atm (760 Torr) under this state, $CO_2$ gas is introduced into the auxiliary and trap chambers 42 and 34. $CO_2$ gas may be introduced into them in this case until their internal pressures become equal to that pressure under which $CO_2$ gas is filled in the gas source 44. Pressures under which $CO_2$ gas is introduced into them are detected by the pressure gauges 48 and 76. About 10 ppm of impurities (such as $N_2$, $O_2$, Ar gases) are surely contained in industrial $CO_2$ gas usually available from the market. Their component rate is about 67% of $N_2$ gas, about 31% of $O_2$ gas and about 1.2% of Ar gas.

Fluid nitrogen is passed through the meandering pipe 22b in the trap chamber 34 to cool the cooling plate 22a. $CO_2$ gas is thus condensed, adhering to the surface of the cooling plate 22a. The valve 39 is kept open in this case. The trap and auxiliary chambers 34 and 42 are thus communicated with each other through the passage 40. As $CO_2$ gas is trapped more and more in the trap chamber 34, therefore, gas in the auxiliary chamber 42 is caused to flow into the trap chamber 34 through the passage 40. This trap lasts until the pressure of $CO_2$ gas in the auxiliary and trap chambers 42 and 34 becomes about $10^{-9}$-$10^{-10}$ at $-196°$ C. Almost none of impurity gases is trapped this time. In short, they are not condensed but uniformly scattered in the trap and auxiliary chambers 34 and 42. The communicating valve 38 is closed under this state. The supply of coolant to the pipe 22b is stopped and heat medium such as nitrogen gas or air is passed instead through the pipe 22c to vaporize the dry ice.

The impurity density of $CO_2$ gas in the trap chamber 34 is thus obtained by the following equation (1).

Impurity density=(original impurity density)×(volume of trap chamber 34)/(volume of auxiliary chamber 42 +volume of trap chamber 34) . . .     (1)

The impurity density in original $CO_2$ gas is 10 ppm, the volume of the auxiliary chamber 42 is 1000 liters and that of the trap chamber 34 is 10 liters. When the equation (1) is replaced by these values, the impurity gas density becomes about 1/100. The impurity density in purified $CO_2$ gas becomes about 0.1 ppm accordingly. While operating the switch valve 78, this purified $CO_2$ gas is stored in the purified gas storing chamber 82 and it is supplied to the load lock chambers 16 and 18, as occasion demands, while controlling its flow rate.

The extent to which the impurity gas density is diluted depends upon the volume rate of the auxiliary and trap chambers 42 and 34, as described above. When this volume rate is appropriately selected, therefore, the extent of dilution can be changed. In addition, gas can be purified without using any mechanical pump when the chamber 42 of large volume and the chamber 34 of small volume are used as seen in this embodiment.

Any other gases such as fluid oxygen, hydrogen and helium may be used as coolant when their temperatures are lower than the condensation temperature of $CO_2$ gas.

Each of the load lock chambers has a volume of 8–50 liters in the case of those semiconductor wafers which have a diameter of 6–12 inches and it has a volume of about 100 liters in the case of LCD substrates. It is therefore needed that the amount of $CO_2$ gas filled and the exhausting pump are appropriately selected depending upon the volume of each load lock chamber. In order to reduce the amount of particles floating in each chamber to an extent as greater as possible, it is preferable that exhausting openings are not locally collected but widely scattered in the chamber.

According to the above-descrabed example, a chamber internal pressure of $1.5 \times 10^{-3}$ Torr could be obtained in the case of commercially available $CO_2$ gas (having a purity of 99.999 volume %) and a chamber internal pressure of $9.8 \times 10^{-5}$ Torr could be obtained in the case of purified $CO_2$ gas (having a higher purity) when compared for a same exhaustion time. According to the above-described example, the trap chamber had the coolant passage and the heat medium passage independent of the coolant one. The heat wearing of the passage pipes could be therefore reduced to thereby make the life of these pipes longer.

Further, the coolant passage was made independent of the heat medium passage. The cooling and heating of the trap chamber could be therefore changed over for a shorter time (about thirty seconds).

Furthermore, no supply and exhaust means such as pump is used to exhaust each chamber vacuous and return it atmospheric. This enables pressure loss to be avoided at the supply and exhaust times. Pressure change in each load lock chamber can be thus more quickly achieved.

A case where the trap device is arranged in each load lock chamber will be described with reference to FIGS. 16 through 18.

Figure 16:
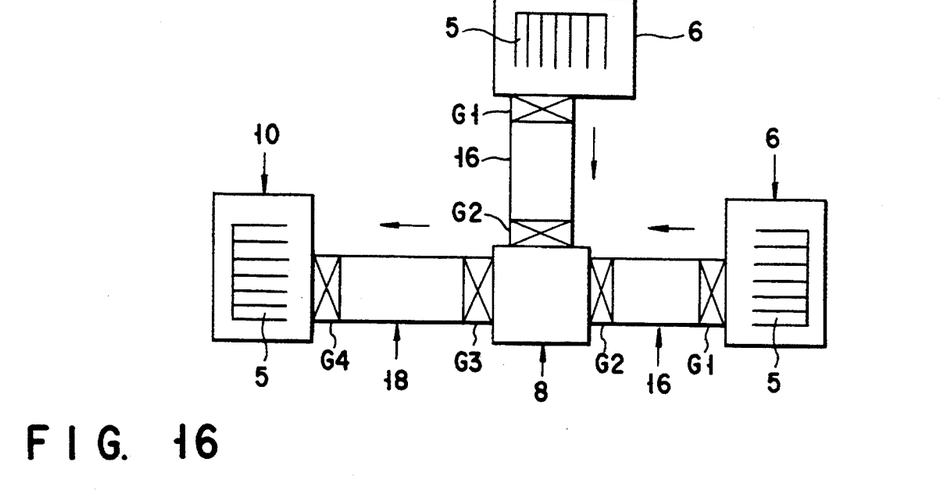
FIG. 16 schematically shows the whole of the semiconductor wafer processing system having a process chamber and three load lock chambers.

As shown in FIG. 16, the etching system has two senders 6 and one receiver 10. The wafer W is carried alternately from the senders 6 into the process chamber 8. The load lock chambers are arranged between each sender 6 and the process chamber 8 and between the receiver 10 and the process chamber 8.

Figure 17:
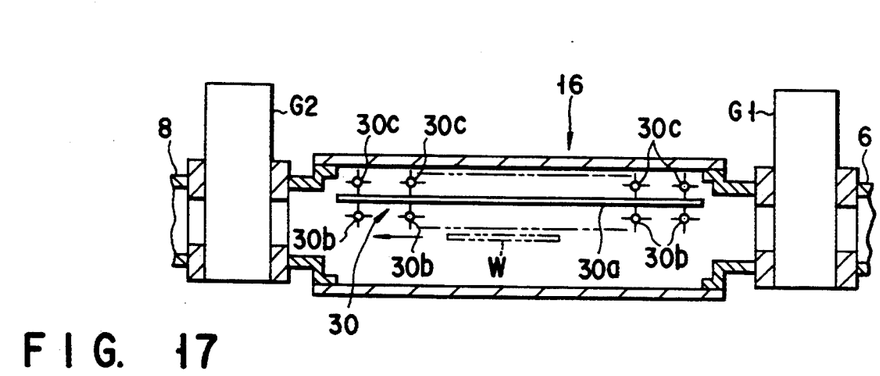
FIG. 17 is a sectional view showing another trap device arranged in the load lock chamber.

As shown in FIG. 17, a trap device 30 is arranged in the upper portion of each load lock chamber 16 and the wafer a is passed under the trap device 30. The trap device 30 has an aluminium-made substrate 30a and coolant passage 30b is arranged on the underside of the substrate 30a while a heat medium passage 30c on the top of the substrate 30a.

When the trap means is reproduced in one of these load lock chambers 16, the wafer w can be carried into the other load lock chamber 16 because this chamber 16 can be opened. This enables the wafer carrying-in operation not to be stopped every time the trap device is reproduced. The productivity of the system can be thus enhanced.

Figure 18:
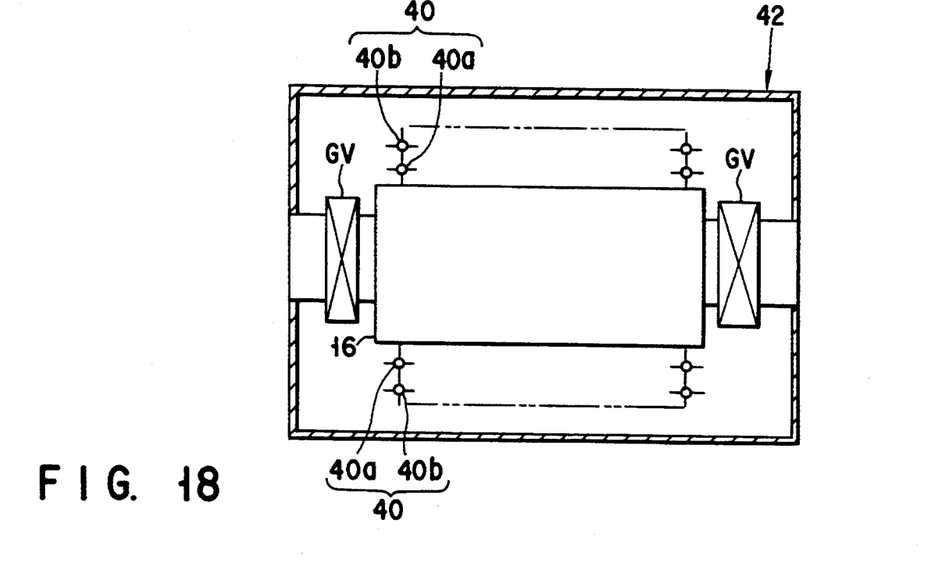
FIG. 18 is a sectional view showing a further trap device arranged in the load lock chamber.

As shown in FIG. 18, the load lock chamber 16 may be arranged in an outer shell 42. A trap device 40 is attached to the outer faces of the load lock chamber 16 and enclosed by the outer shell 42. The trap device 40 is a combination of meandering pipes 40a and 40b and this assembly of pipes 40a and 40b is substantially same as that of meandering pipes 22b and 22c shown in FIG. 10.

It as preferable in this case that the space between the outer shell 42 and the load lock chamber 16 is heat-insulated by vacuum insulation or by inserting heat insulator into the space. When arranged in this manner, dry ice can be stuck on the outer faces of the load lock chamber 16 so that the dry ice adhering area can be made larger. The load lock chamber can be thus more quickly made highly vacuous. Exhausting efficiency will be described referring to FIG. 15.

Figure 15:
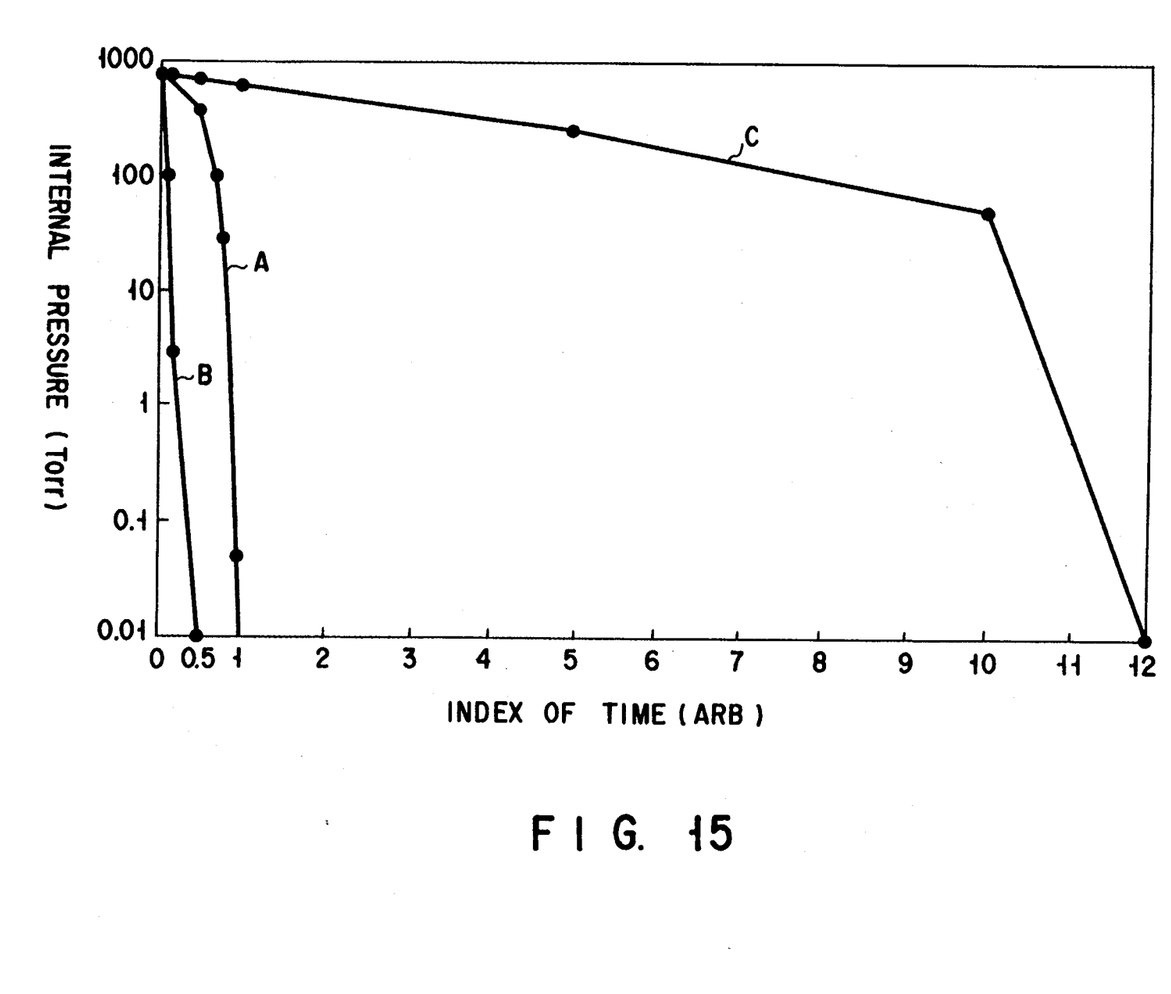
FIG. 15 is a graph showing characteristic curves obtained relating to efficiencies of exhausting the chamber according to the method of the present invention and according to the conventional ones.

The horizontal axis of a graph shown in FIG. 15 represents index of time and the vertical axis thereof denotes chamber internal pressure. Results obtained when the chamber is exhausted according to three kinds of method by the rotary pump are shown in the graph shown in FIG. 15. A curve A in the graph represents the characteristic of exhausting efficiency obtained when cooling exhaustion is carried out using high purity $CO_2$ gas (embodiment 1), a curve B the characteristic of exhausting efficiency obtained when common exhaustion is carried out by the rotary pump (control 1), and a curve C the characteristic of exhausting efficiency obtained when slow exhaustion (exhaustion is carried out little by little to reduce the amount of particles floating) is carried out by the rotary pump (control 2). As apparent from the graph, the index of time during which the internal pressure in the chamber reaches $1 \times 10^{-2}$ was standard (value 1) in the case of the embodiment 1, the value of the control 1 was 0.5, and the value of the control 2 was 12. when the control 1 is regarded as a reference, the exhausting time in the embodiment 1 is 2 times and that in the control 2 is 24 times. The exhausting time in the embodiment 1 becomes longer as compared with that in the control 1, but the number of particles floating can be reduced to a greater extent in the embodiment 1, as compared with that in the control 1.

The number of particles adhering to the wafer W was checked in the embodiment 1 and in the controls 1 and 2.

Those particles which adhered to the 6-inch wafer w and which had a diameter larger than 0.2 um were counted. The number of these particles was counted before and after exhaustion while viewing particles by optical detector. The number of particles adhered was 25000–40000 units in the case of the control 1, 25 units in the case of the control 2, and 15 units in the case of the embodiment 1.

FIGS. 19 through 24 show variations of the trap-device-provided chamber.

Figure 19:
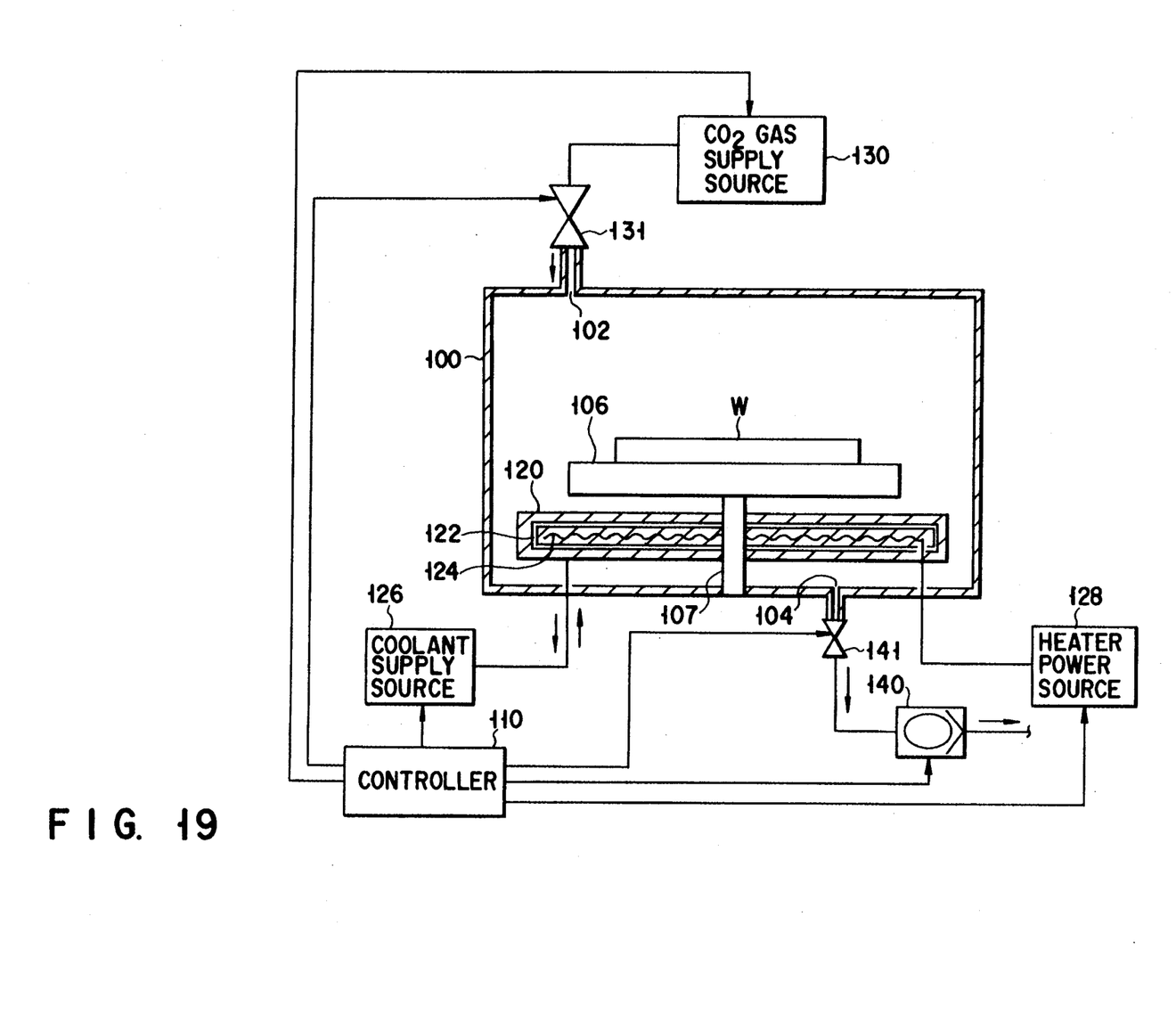
FIG. 19 is a sectional view showing a fundamental load lock chamber provided with the wafer-mounted stage and the trap device.

As shown in FIG. 19, a chamber 100 is provided with gas introducing and exhausting openings 102 and 104. The gas introducing opening 102 is communicated with a $CO_2$ gas supply source 130 through a flow rate adjuster valve 131. It is formed in the ceiling of the chamber 100. The gas exhausting opening 104 is communicated with a turbo molecular pump 140 through a flow rate adjuster valve 141.

A wafer-mounted stage 106 is supported by a shaft 107 in the chamber 100. A trap device 120 is arranged just under the wafer-mounted stage 106. An internal passage 122 is formed in a substrate of the trap device 120 and it is communicated with a coolant supply source 126. A heater 124 is embedded in the substrate of the trap device 120 and it is connected to a power source 128. The coolant supply source 126, the heater power source 128, the $CO_2$ gas supply source 130 and the valves 131, 141 are controlled by a controller 110.

According to this trap-device-provided chamber, $CO_2$ gas is solidified when coolant is passed through the passage 122 and dry ice is vaporized when current is applied to the heater 124.

Figure 20:
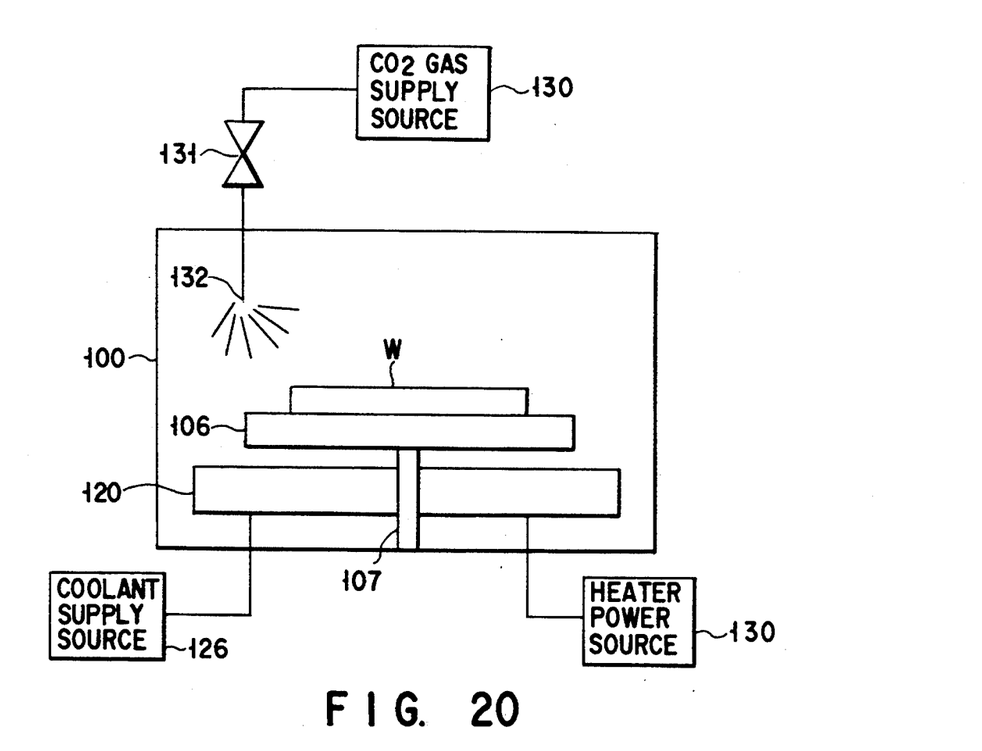
FIGS. 20 through 23 are sectional views showing some variations of the load lock chamber provided with various $CO_2$ gas introducing means.

In the case of a trap-device-provided chamber shown in FIG. 20, a nozzle 132 as positioned in the chamber 100 to supply $CO_2$ gas near the wafer W and the trap device 120.

Figure 21:
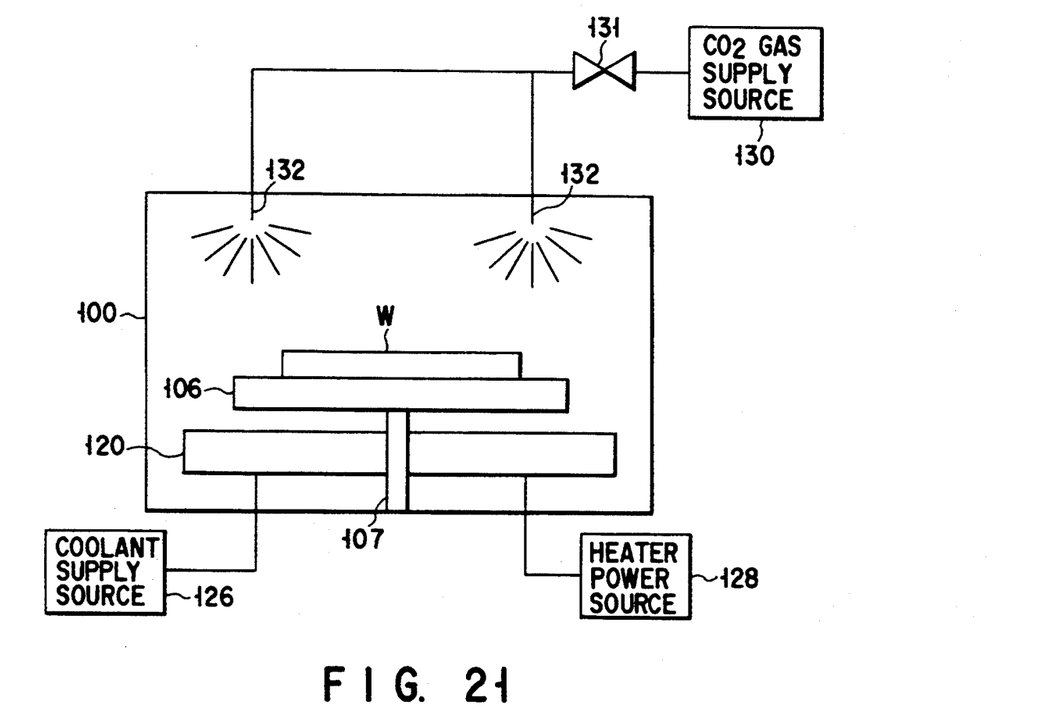

In the case of a trap-device-provided chamber shown in FIG. 21, two nozzles 132 are positioned in the chamber 100 to supply $CO_2$ gas near the wafer W and the trap device 120. According to this chamber, the amount of $CO_2$ gas jetted through each of the nozzles 132 can be made less to thereby reduce the number of particles floating.

Figure 22:
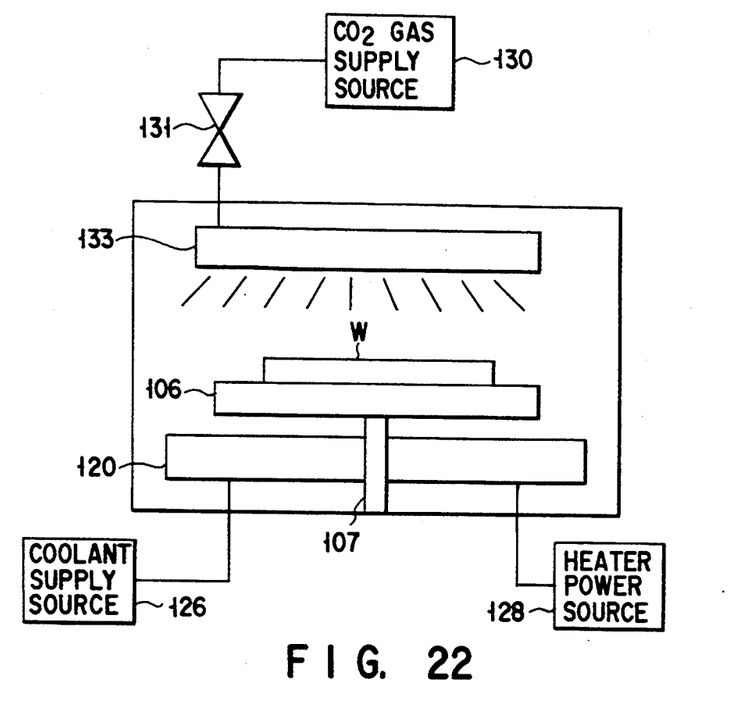

In the case of a trap-device-provided chamber shown in FIG. 22, $CO_2$ gas is introduced into the chamber 100 through a shower head 133. The shower head 133 is shaped like a disk and has 100–200 apertures each having a diameter of 1–2 mm in the underside thereof. It is intended to uniformly supply $CO_2$ gas into the chamber 100. This prevents particles from floating in the chamber 10.

Figure 23:
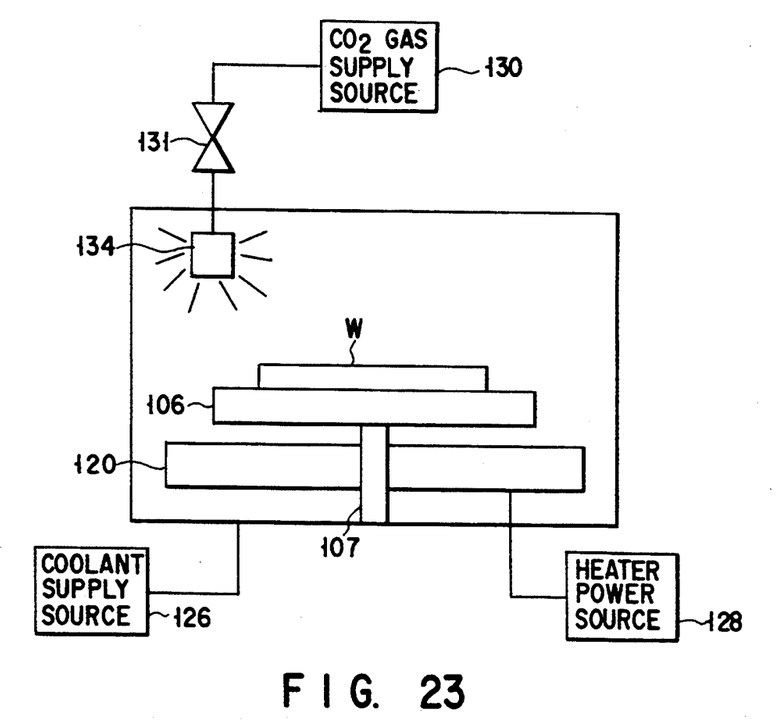

In the case of a trap-device-provided chamber shown in FIG. 23, $CO_2$ gas is introduced into the chamber 100 through a diffusing filter 134. The diffusing filter 134 is made of porous sintered ceramics and it is intended to soften the force of $CO_2$ gas jetted. This can reduce the number of particles floating in the chamber 100.

Figure 24:
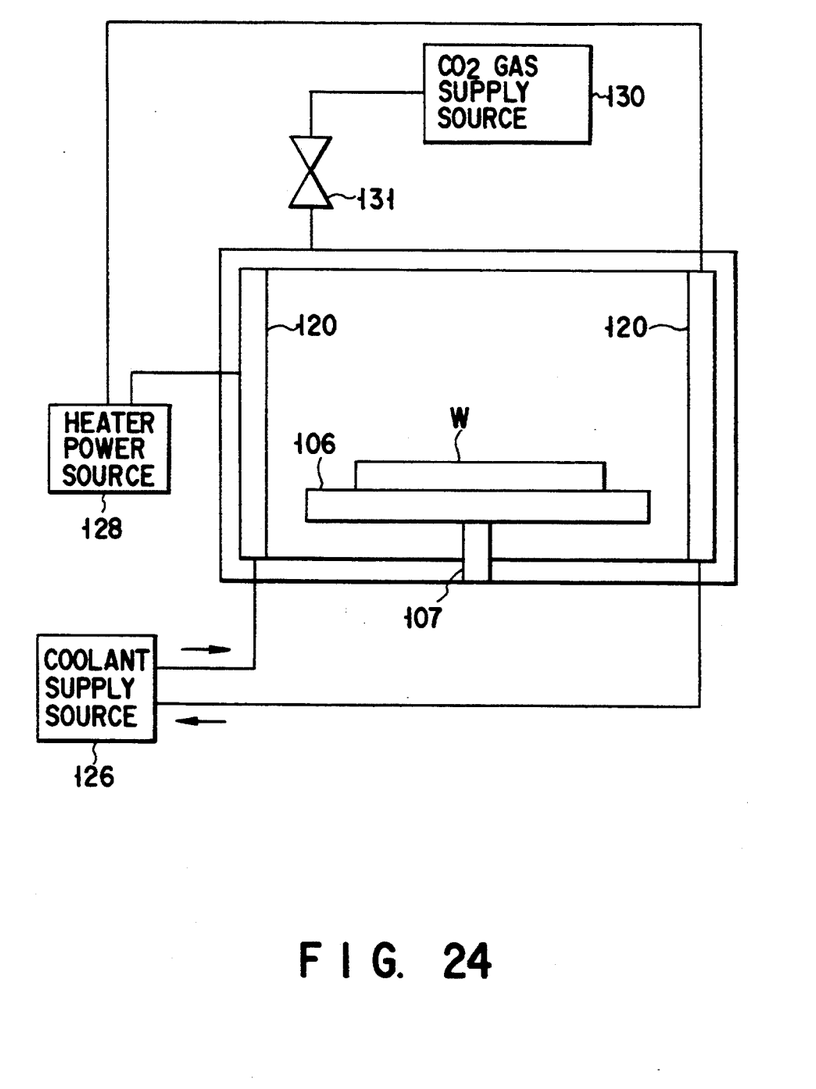
FIG. 24 is a sectional view showing a further variation of the load lock chamber having a cooling plate arranged at a different position.

In the case of a trap-device-provided chamber shown in FIG. 24, the trap device 120 is attached to both sides of the chamber 100.

According to the present invention as described above, the coolant and heat medium passages attached to the trap means are independent of the other. Medium exchange is thus made unnecessary. Therefore, the heat wearing of that portion of each passage through which a medium is supplied can be reduced. A trap device having a higher durability can be thus provided.

According to the present invention, the passage through which a medium is supplied is made independent of the other passage through which another medium is supplied. The ineffective rising of temperature can be thus cancelled and the time needed to collect each of gases and reproduce the trap device can be made shorter. In addition, it can be prevented that water component in heat medium is solidified to jam the passage because coolant and heat medium are not supplied through the same passage.

Accordingly, the durability of each component cannot be lost. The efficiency of collecting each of gases can also be increased. In addition, the efficiency of making each chamber vacuous cannot be decreased. This enables each of gases to be more efficiently exhausted to make each chamber highly vacuous.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A vacuum creating method employed in the manufacture of semiconductor devices, comprising:
   preparing a load lock chamber defining a space in which semiconductor substrates are to be disposed;
   exhausting said load lock chamber through a portion lower than the location of the semiconductor substrate disposed within the load lock chamber so as not to generate a gaseous stream causing particles to be attached to the substrate;
   filling the space within said load lock chamber with a gas whose vapor pressure becomes higher than 1 atm at ambient temperature but lower than 10 Torr at a temperature lower than the ambient temperature;
   carrying semiconductor substrates into the load lock chamber;
   cooling the gas within the space of the load lock chamber to solidify, thereby lowering the inner pressure of the load lock chamber to a high vacuum;
   taking the semiconductor substrates out of the load lock chamber; and
   heating the space to vaporize the solidified gas, thereby returning the internal pressure of the load lock chamber back to atmospheric pressure.

2. The vacuum creating method according to claim 1, wherein the gas filled is $CO_2$ gas.

3. The vacuum creating method according to claim 2, wherein said $CO_2$ gas used is purified by removing oxygen, nitrogen and argon from the $CO_2$ gas.

4. The vacuum creating method according to claim 1, wherein fluid nitrogen is used as coolant for cooling the gas filled.

5. The vacuum creating method according to claim 1, wherein a member other than the substrate is cooled to solidify the gas filled on the surface of the member.

6. The vacuum creating method according to claim 5, further comprising heating the cooled member to vaporize the solidified object on the member.

7. The vacuum creating method according to claim 5, further comprising carrying the member which is to be cooled into the chamber.

8. The vacuum creating method according to claim 5, wherein the member to be cooled is a metal plate provided with a coolant passage.

9. The vacuum creating method according to claim 5, wherein the member to be cooled includes walls of the chamber.

10. A vacuum creating apparatus employed in the manufacture of semiconductor devices, comprising:
    a chamber defining a space in which semiconductor substrates are to be disposed;
    exhaust means having an exhausting port communicating with a lower portion of said chamber for exhausting the chamber so as not to generate a gaseous stream causing particles to be attached to the substrate; and
    trapping means for trapping gas molecules present within the chamber, said trapping means including:
    a condensing member having a surface on which the gas molecules are condensed and solidified;
    a cooling passage communicating with a coolant supply source for supplying a coolant to cool said condensing member; and a heat medium passage communicating with a heat medium supply source for supplying a heat medium to heat the condensing member;

wherein said cooling passage and heat medium passage are formed independently of each other in the condensing member.

11. The vacuum creating apparatus according to claim 10, wherein the trap means is arranged in the chamber.

12. The vacuum creating apparatus according to claim 10, wherein the trap means is arranged movable between a load lock chamber and a reproducing chamber and when the trap means is positioned in the load lock chamber, the coolant is supplied into the coolant passage and when it is positioned in the reproducing chamber, the heat medium is supplied into the heat medium passage.

13. The vacuum creating apparatus according to claim 10, wherein plural load lock chambers are arranged around a process chamber in which the substrate is processed, and the trap means is arranged in each of these load lock chambers.

14. The vacuum creating apparatus according to claim 10, further comprising a gas purifying device serving to separate at least two gases which have different condensation point temperatures, and including a trap chamber in which said at least two gases are contained, and having cooling means arranged in said trap chamber, for allowing the coolant having a lower temperature than one of the at least two gases which has a higher condensation point temperature than the others, to be passed through said trap chamber.

15. The vacuum creating apparatus according to claim 14, wherein said one of the at least two gases whose condensation point temperature is higher is carbon dioxide gas, the other gases whose condensation point temperature is lower include at least nitrogen and oxygen gases, and the coolant is fluid nitrogen.

16. The vacuum creating apparatus according to claim 14, wherein the trap chamber is connected to exhausting means through which gases in the trap chamber is exhausted.

17. The vacuum creating apparatus according to claim 14, wherein the trap chamber is connected to an auxiliary chamber, which has a volume larger than that of the trap chamber, in such a way that it can be communicated with and shielded from the auxiliary chamber.

18. A vacuum creating method employed in the manufacture of semiconductor devices, comprising:

preparing a process chamber defining a space in which semiconductor substrates are to be disposed;

exhausting said process chamber through a portion lower than the location of the semiconductor substrate disposed within the process chamber so as not to generate a gaseous stream causing particles to be attached to the substrate;

filling the space within the process chamber with a gas whose vapor pressure becomes higher than 1 atm at ambient temperature but lower than 10 Torr at a temperature lower than the ambient temperature;

carrying semiconductor substrates into the process chamber;

cooling the gas within the space of the process chamber to solidify, thereby lowering the inner pressure of the process chamber to a high vacuum;

treating the semiconductor substrates within the process chamber of a predetermined vacuum level;

taking the semiconductor substrates out of the process chamber; and heating the solidified object to vaporize, thereby returning the internal pressure of the process chamber back to atmospheric pressure.

19. The vacuum creating method according to claim 1, wherein a gas whose equilibrium vapor pressure at a temperature lower than the ambient temperature is $10^{-3}$ Torr is filled in the space of the load lock chamber.

20. The vacuum creating apparatus according to claim 10, which further comprises a plurality of nozzles, which are positioned above the semiconductor substrate within the chamber, for supplying into the chamber a gas whose vapor pressure becomes higher than 1 atm at ambient temperature but lower than 10 Torr at a temperature lower than the ambient temperature.

21. The vacuum creating apparatus according to claim 10, which further comprises a shower head, which is positioned above the semiconductor substrate within the chamber, for supplying into the chamber a gas whose vapor pressure becomes higher than 1 atm at ambient temperature but lower than 10 Torr at a temperature lower than the ambient temperature.

22. The vacuum creating apparatus according to claim 10, which further comprises a diffusion filter made of a porous ceramic sintered body, which is positioned above the semiconductor substrate within the chamber, for supplying into the chamber a gas whose vapor pressure becomes higher than 1 atm at ambient temperature but lower than 10 Torr at a temperature lower than the ambient temperature.

* * * * *